(12) United States Patent
Tseng et al.

(10) Patent No.: US 11,128,264 B1
(45) Date of Patent: Sep. 21, 2021

(54) BIAS COMPENSATION CIRCUIT AND AMPLIFYING MODULE

(71) Applicant: WIN Semiconductors Corp., Tao Yuan (TW)

(72) Inventors: Po-Kie Tseng, Taoyuan (TW);
Chih-Wen Huang, Taoyuan (TW);
Jui-Chieh Chiu, Taoyuan (TW);
Shao-Cheng Hsiao, Taoyuan (TW)

(73) Assignee: WIN Semiconductors Corp., Tao Yuan (TW)

( * ) Notice: Subject to any disclaimer, the term of this patent is extended or adjusted under 35 U.S.C. 154(b) by 0 days.

(21) Appl. No.: 16/852,540

(22) Filed: Apr. 19, 2020

(51) Int. Cl.
*H03F 3/04* (2006.01)
*H03F 1/30* (2006.01)

(52) U.S. Cl.
CPC .............. *H03F 1/302* (2013.01); *H03F 1/301* (2013.01); *H03F 2200/303* (2013.01); *H03F 2200/481* (2013.01); *H03F 2200/555* (2013.01)

(58) Field of Classification Search
CPC .... H03F 1/302; H03F 1/301; H03F 2200/555; H03F 2200/481; H03F 2200/303; H03F 3/04; H03F 2200/18; H03F 1/0261; H03F 3/3076; H03F 3/3066; H03F 1/307; H03F 3/26; H03F 3/3088; H03F 1/026; H03G 3/3042; H03G 3/3047

USPC .......................................................... 330/296
See application file for complete search history.

(56) References Cited

U.S. PATENT DOCUMENTS

| | | | |
|---|---|---|---|
| 3,984,783 A * | 10/1976 | Bickley | H03F 1/0261 330/296 |
| 7,348,854 B1 * | 3/2008 | Mordkovich | H03F 1/301 330/285 |
| 8,188,794 B2 * | 5/2012 | Lautzenhiser | H03F 1/301 330/285 |
| 8,350,418 B2 | 1/2013 | Metzger | |
| 10,680,558 B2 * | 6/2020 | Satou | H03F 1/0261 |
| 2014/0333382 A1 | 11/2014 | Lautzenhiser | |

* cited by examiner

*Primary Examiner* — Khanh V Nguyen
(74) *Attorney, Agent, or Firm* — Winston Hsu

(57) ABSTRACT

A bias compensation circuit, coupled to an amplifying transistor, is disclosed. The bias compensation circuit comprises a voltage locking circuit, comprising a first terminal and a second terminal, wherein the first terminal is coupled to a third terminal the amplifying transistor, and the second terminal is coupled to a control terminal of the amplifying transistor; and a first resistor, coupled to the first terminal of the voltage locking circuit; wherein when the voltage locking circuit is conducted, a voltage difference between the first terminal and the second terminal is substantially constant.

19 Claims, 4 Drawing Sheets

BIAS COMPENSATION CIRCUIT AND AMPLIFYING MODULE

BACKGROUND OF THE INVENTION

1. Field of the Invention

The present application relates to a bias compensation circuit and an amplifying module, and more particularly, to a bias compensation circuit and an amplifying module capable of providing a stable biased current.

2. Description of the Prior Art

As a demand of 5G communication systems grows, millimeter wave technology is important in commercial consumer electronics. The good characteristics of GaAs (gallium arsenide) at high/radio frequencies have been widely used in the millimeter wave field. In practice, for mass production, the requirement of stability and invariability of turn on voltage of fabricated transistors after fabrication process or under various temperatures is an important issue.

In many applications of pHEMT, a bias circuit is required to compensate temperature and process variations and maintain stable characteristics. In the art, operational amplifiers or current sources are used to perform the compensation. The operational amplifier or current source may have finer control. However, combining operational amplifier or current source may require additional CMOS or bipolar process, which sacrifices the production cost and a degree of integration.

Therefore, it is necessary to improve the prior art.

SUMMARY OF THE INVENTION

It is therefore a primary objective of the present application to provide a bias compensation circuit and an amplifying module capable of providing a stable turn on voltage, to improve over disadvantages of the prior art.

An embodiment of the present application discloses a bias compensation circuit, coupled to an amplifying transistor. The bias compensation circuit comprises a voltage locking circuit, comprising a first terminal and a second terminal, wherein the first terminal is coupled to a third terminal the amplifying transistor, and the second terminal is coupled to a control terminal of the amplifying transistor; and a first resistor, coupled to the first terminal of the voltage locking circuit; wherein when the voltage locking circuit is conducted, a voltage difference between the first terminal and the second terminal is substantially constant.

An embodiment of the present application further discloses an amplifying module. The amplifying module comprises an amplifying transistor; and a bias compensation circuit, coupled to the amplifying transistor, the bias compensation circuit comprising a voltage locking circuit, comprising a first terminal and a second terminal, wherein the first terminal is coupled to a third terminal the amplifying transistor, and the second terminal is coupled to a control terminal of the amplifying transistor; and a first resistor, coupled to the first terminal of the voltage locking circuit; wherein when the voltage locking circuit is conducted, a voltage difference between the first terminal and the second terminal is substantially constant.

These and other objectives of the present invention will no doubt become obvious to those of ordinary skill in the art after reading the following detailed description of the preferred embodiment that is illustrated in the various figures and drawings.

DETAILED DESCRIPTION

In the present application, a control terminal of a transistor is referred to a gate of the transistor, when the transistor is an FET (Field Effect Transistor) or a (p)HEMT ((Pseudomorphic) High Electron Mobility Transistor), or referred to a base of the transistor, when the transistor is a BJT (Bipolar Junction Transistor) or an HBT (Heterojunction Bipolar Transistor). A terminal of a transistor is referred to a source or a drain of the transistor, when the transistor is an FET or a (p)HEMT, or referred to an emitter or collector of the transistor, when the transistor is a BJT or an HBT. For illustrative purpose, the following description takes N-type (p)HEMT or FET as an example, which is not limited thereto.

Figure 1:
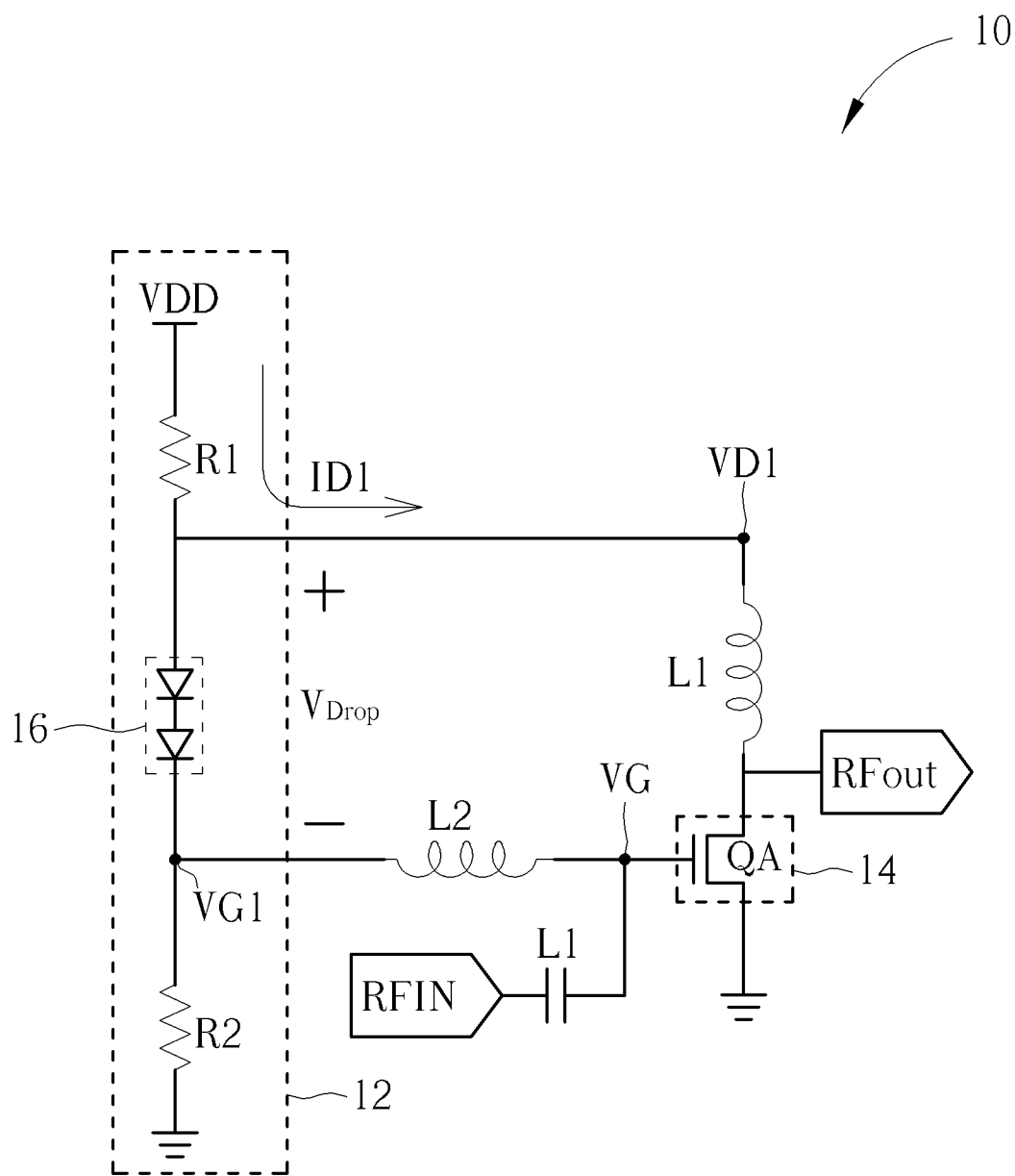
FIG. 1 is a schematic diagram of an amplifying module according to an embodiment of the present application.

FIG. 1 is a schematic diagram of an amplifying module 10 according to an embodiment of the present application. The amplifying module 10 comprises a bias compensation circuit 12 and an amplifying circuit 14. In the embodiment illustrated in FIG. 1, the amplifying circuit 14 comprises an amplifying transistor QA.

The amplifying module 10 may be formed within a die. In an embodiment, the die may be a GaAs (Gallium Arsenide) die, which is not limited thereto. Note that, the turn on voltage Vto and the threshold voltage $V_{th}$ are used interchangeably in the present application.

The bias compensation circuit 12 comprises a voltage locking circuit 16, a current sensing component R1 and a voltage drop component R2. The current sensing component R1 has an equivalent resistance, which is also denoted as R1. Similarly, the voltage drop component R2 has an equivalent resistance, which is also denoted as R2. In the embodiment illustrated in FIG. 1, the components R1 and R2 are realized by (or comprise) passive resistors, but not limited thereto (which will be illustrated later). The voltage locking circuit 16 is a circuit which is able to lock a voltage difference between two terminals thereof when the voltage locking circuit 16 is conducted. In other words, when the voltage locking circuit 16 is conducted, the voltage difference between the two terminals of the voltage locking circuit 16 is remained constant or substantially constant. It can be regarded that the voltage locking circuit 16 produces a constant voltage drop/difference, e.g., $V_{Drop}$ shown in FIG. 1. In the embodiment illustrated in FIG. 1, the voltage locking circuit 16 comprises two diodes connected in a series, which is not limited thereto. In some embodiment, the voltage locking circuit may comprise one diode or a plurality of diodes connected in a series.

Specifically, the voltage locking circuit 16 comprises a first terminal and a second terminal. The first terminal of the voltage locking circuit 16 is coupled to a drain of the amplifying transistor QA via an inductor L1. The second terminal of the voltage locking circuit 16 is coupled to a gate of the amplifying transistor QA via an inductor L2. A terminal of the resistor R1 is coupled to the first terminal of the voltage locking circuit 16, and another terminal of the resistor R1 receives a voltage VDD. The resistor R2 is coupled between the second terminal of the voltage locking circuit 16 and a ground.

In an embodiment, a resistance of the resistor R2 is much larger than a resistance of the resistor R1. For example, the resistance of the resistor R2 may be at least 100 times of the resistance of the resistor R1, i.e., R2>100*R1. Due to the fact that the resistance of the resistor R2 is much larger than the resistance of the resistor R1, a current flowing through the resistor R1 would be almost diverted to the inductor L1, and current flows through the voltage locking circuit 16 may be neglected. For simplicity, no current flowing through the voltage locking circuit 16 is assumed.

Negative feedback mechanism of the bias compensation circuit 12 is illustrated in the below. A current flowing through the transistor can be expressed as eq. 1. When the turn on voltage Vto and the threshold voltage $V_{th}$ decreases/increases (due to fabrication or temperature variation), a current ID flowing through the amplifying transistor QA would increase/decrease, a voltage VD1 (where VD1=VDD—ID1*R1) at the first terminal of the voltage locking circuit 16 would decrease/increase, a voltage VG (where VG=VD1-$V_{Drop}$) would decrease/increase, which causes that the current ID1 decrease/increase. Therefore, the (biased) current ID1 may be stabilized.

$$I_D = \frac{\mu_n C_{ox}}{2} \frac{W}{L}(V_{GS} - V_{th})^2 \quad \text{(eq. 1)}$$

Figure 2:
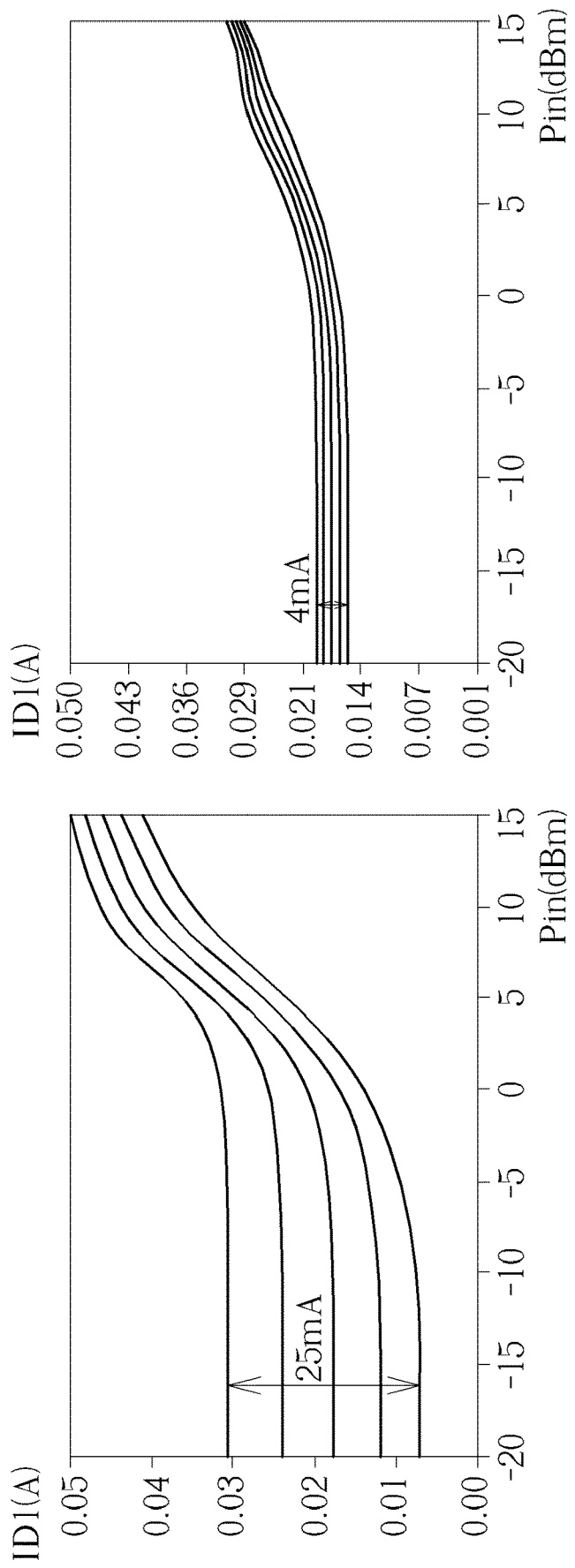
FIG. 2 is a schematic diagram of currents of the amplifying module of under various turn on voltages.

FIG. 2 represents results of the current ID1 flowing through the amplifying transistor QA under various turn on voltages Vto. The variation of the turn on voltages Vto lies between ±0.1V (volt). Different curves in FIG. 2 represent ID corresponding to different turn on voltages Vto. The left/right portion of FIG. 2 represent results of the current ID1 flowing through the amplifying transistor QA without/with the bias compensation circuit 12. The horizontal axis represents input power, denoted as Pin, of the amplifying transistor QA, and the vertical axis represents the current ID1. As can be seen from FIG. 2, when the input power Pin is low (e.g., less than −10 dBm), a variation of the current ID1 corresponding to the case without compensation is about 25 mA (milliampere). On the other hand, a variation of the current ID1 corresponding to the case with compensation, i.e., with the bias compensation circuit 12, is reduced to 4 mA. Therefore, the bias compensation circuit 12 is able to effectively reduce the current variation due to turn on voltage variation and stabilize the biased current ID1.

Figure 3:
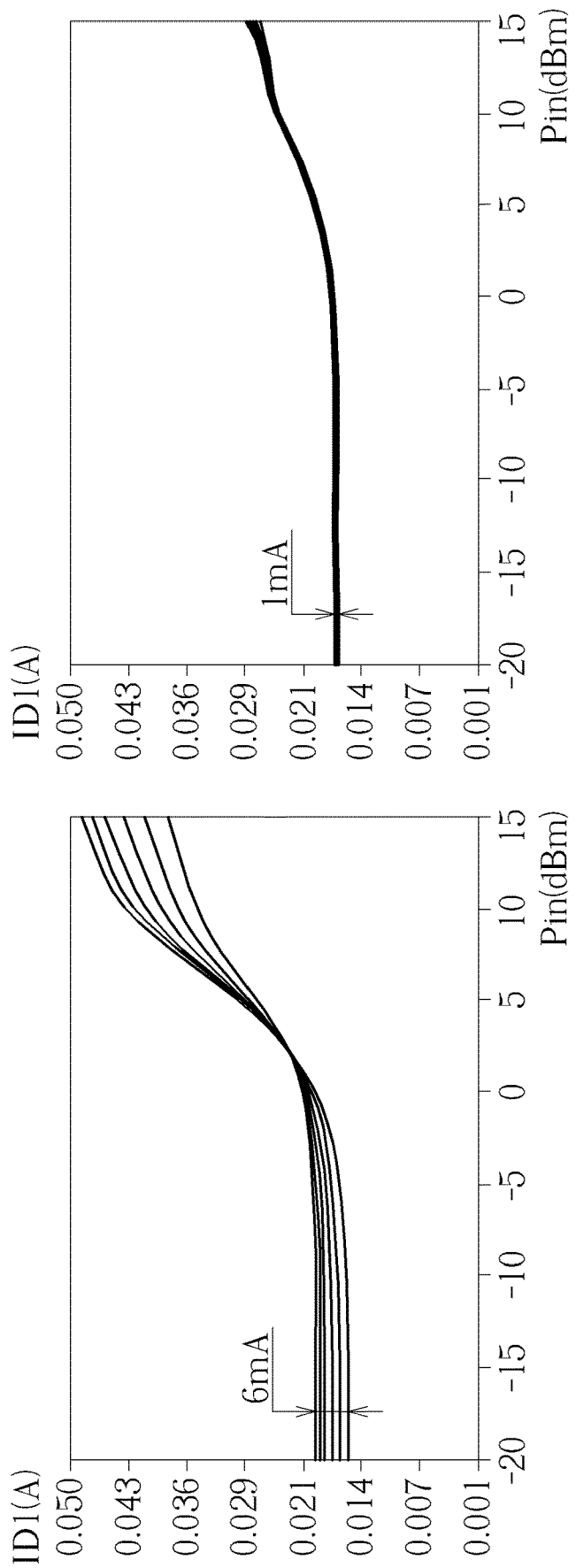
FIG. 3 is a schematic diagram of currents of the amplifying module of under various temperatures.

FIG. 3 represents results of the current ID1 flowing through the amplifying transistor QA under various temperatures. The variation of the temperatures lies between −30° C.~80° C. Different curves in FIG. 3 represent ID1 corresponding to different temperatures. The left/right portion of FIG. 3 represent results of the current ID1 flowing through the amplifying transistor QA without/with the bias compensation circuit 12. The horizontal axis represents input power, denoted as Pin, of the amplifying transistor QA, and the vertical axis represents the current ID1. As can be seen from FIG. 3, when the input power Pin is low (e.g., less than −10 dBm), a variation of the current ID1 corresponding to the case without compensation is about 6 mA. On the other hand, a variation of the current ID1 corresponding to the case with compensation, i.e., with the bias compensation circuit 12, is reduced to 1 mA. Therefore, the bias compensation circuit 12 is able to reduce the current variation due to temperature variation and stabilize the biased current ID1.

In a short remark, the bias compensation circuit 12 is able to reduce the current variation due to the turn on voltage variation and the temperature variation. Therefore, the bias compensation circuit 12 and the amplifying module 10 are able to provide a stable biased current, e.g., ID1.

Note that, the turn on voltage variation in unavoidable after a fabrication process. That is, fabricating a wafer (comprising a plurality of dies) may result in various turn on voltages corresponding to the plurality of transistors. The bias compensation circuit 12 is suitable for a scenario that the turn on voltages of the transistors within one die are different, but not limited therein.

Notably, the embodiments stated in the above are utilized for illustrating the concept of the present application. Those skilled in the art may make modifications and alterations accordingly, and not limited herein. For example, the voltage lock circuit may comprise one transistor or multiple transistors connected in a series, where a drain and a gate are electrically connected for the transistor(s) within the voltage lock circuit. In addition, the current sensing component R1 may comprise (or be realized by) a transistor type resistor, which is a transistor functioning as a resistor with the resistance R1, which is within the scope of the instant application. Similarly, the voltage drop component R2 may comprise (or be realized by) a transistor type resistor with the resistance R2 or a diode, which is also within the scope of the instant application.

Figure 4:
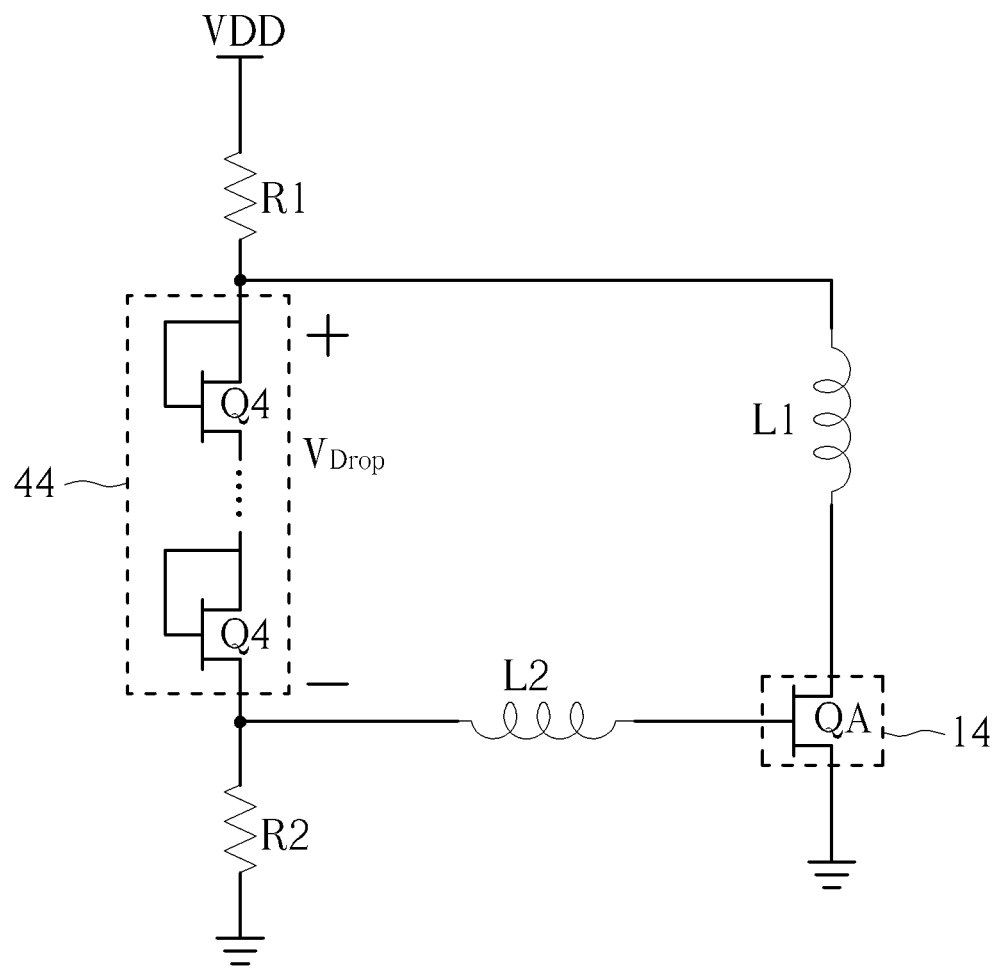
FIG. 4 is a schematic diagram of a voltage locking circuit according to an embodiment of the present application.

FIG. 4 illustrates a schematic diagram of a voltage lock circuit 44 according to an embodiment of the present application. As shown in FIG. 4, the voltage lock circuit 44 comprises a plurality of transistors Q4 connected in a series, where a drain and a gate of the transistor Q4 are electrically connected. Furthermore, the voltage lock circuit may comprise single transistor Q4 only. As long as the voltage locking circuit can produces a constant voltage drop/difference, the requirement of the present application is satisfied, which is within the scope of the present application.

In summary, the bias compensation circuit of the present application utilizes the voltage locking circuit to stabilize the biased current, such that the bias compensation circuit and the amplifying module are able to provide the stable biased current.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A bias compensation circuit, coupled to an amplifying transistor, the bias compensation circuit comprising:
   a voltage locking circuit, comprising a first terminal and a second terminal, wherein the first terminal is directly connected to a first end of a first inductor, a second end of the first inductor is coupled to a third terminal of the amplifying transistor, the second terminal is directly connected to a first end of a second inductor, and a second end of the second inductor is coupled to a control terminal of the amplifying transistor; and
   a current sensing component, wherein a first end of the current sensing component is coupled to the first terminal of the voltage locking circuit, and a second end of the current sensing component is not coupled to the voltage locking circuit;

wherein when the voltage locking circuit is conducted, a voltage difference between the first terminal and the second terminal is substantially constant.

2. The bias compensation circuit of claim 1, wherein the voltage locking circuit comprises a diode or a plurality of diodes connected in a series.

3. The bias compensation circuit of claim 1, wherein the current sensing component comprises a first resistor with a first resistance or a transistor type resistor.

4. The bias compensation circuit of claim 1, further comprising:
a voltage drop component, comprising:
a first terminal, coupled to the second terminal to the voltage locking circuit; and
a second terminal, coupled to a ground.

5. The bias compensation circuit of claim 4, wherein the current sensing component comprises a first resistor with a first resistance, the voltage drop component comprises a second resistor with a second resistance, the second resistance of the second resistor is at least 100 times of a first resistance of the first resistor.

6. The bias compensation circuit of claim 4, wherein the voltage drop component comprises a transistor type resistor or a diode.

7. The bias compensation circuit of claim 1, wherein the voltage locking circuit comprises a transistor or a plurality of transistors connected in a series, and a gate and a drain of the transistor or the plurality of transistors are electrically connected.

8. The bias compensation circuit of claim 1, wherein a first voltage at the first terminal of the voltage locking circuit and a second voltage at the second terminal of the voltage locking circuit decrease when a turn-on voltage or a threshold voltage of the amplifying transistor decreases, and the first voltage at the first terminal and the second voltage at the second terminal increase when the turn-on voltage or the threshold voltage of the amplifying transistor increases.

9. The bias compensation circuit of claim 1, wherein a control voltage at the control terminal of the amplifying transistor decreases when a turn-on voltage or a threshold voltage of the amplifying transistor decreases, and the control voltage at the control terminal of the amplifying transistor increases when the turn-on voltage or the threshold voltage of the amplifying transistor increases.

10. The bias compensation circuit of claim 1, wherein the second end of the current sensing component is coupled to a power supply.

11. The bias compensation circuit of claim 1, wherein the second end of the current sensing component is directly connected to a power supply.

12. An amplifying module, comprising:
an amplifying transistor; and
a bias compensation circuit, coupled to the amplifying transistor, the bias compensation circuit comprising:
a voltage locking circuit, comprising a first terminal and a second terminal, wherein the first terminal is directly connected to a first end of a first inductor, a second end of the first inductor is coupled to a third terminal the amplifying transistor, the second terminal is directly connected to a first end of a second inductor, and a second end of the second inductor is coupled to a control terminal of the amplifying transistor; and
a current sensing component, wherein a first end of the current sensing component is coupled to the first terminal of the voltage locking circuit, and a second end of the current sensing component is not coupled to the voltage locking circuit;
wherein when the voltage locking circuit is conducted, a voltage difference between the first terminal and the second terminal is substantially constant.

13. The amplifying module of claim 12, wherein the voltage locking circuit comprises a diode or a plurality of diodes connected in a series.

14. The amplifying module of claim 12, wherein the current sensing component comprises a first resistor with a first resistance or a transistor type resistor.

15. The amplifying module of claim 12, further comprising:
a voltage drop component, comprising:
a first terminal, coupled to the second terminal to the voltage locking circuit; and
a second terminal, receiving a ground.

16. The amplifying module of claim 15, wherein the current sensing component comprises a first resistor with a first resistance, the voltage drop component comprises a second resistor with a second resistance, the second resistance of the second resistor is at least 100 times of a first resistance of the first resistor.

17. The amplifying module of claim 15, wherein the voltage drop component comprises a transistor type resistor or a diode.

18. The amplifying module of claim 12, wherein the voltage locking circuit comprises a transistor or a plurality of transistors connected in a series, and a gate and a drain of the transistor or the plurality of transistors are electrically connected.

19. The amplifying module of claim 12, wherein the amplifying module is formed within a die.

* * * * *